(12) United States Patent
Yan et al.

(10) Patent No.: US 6,816,718 B2
(45) Date of Patent: Nov. 9, 2004

(54) DC OFFSET CORRECTION USING DUMMY AMPLIFIER

(75) Inventors: Kelvin Kai Tuan Yan, High Point, NC (US); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 505 days.

(21) Appl. No.: 10/072,361

(22) Filed: Feb. 7, 2002

(65) Prior Publication Data

US 2003/0148750 A1 Aug. 7, 2003

(51) Int. Cl.[7] ................................................. H04B 1/10
(52) U.S. Cl. ....................... 455/317; 455/296; 455/283
(58) Field of Search ............................ 455/130, 132, 455/140, 316, 317, 310, 296, 313, 341, 334, 283, 278.1, 253.2, 222, 225, 552.1

(56) References Cited

U.S. PATENT DOCUMENTS

| | | | | |
|---|---|---|---|---|
| 5,422,889 A | * | 6/1995 | Sevenhans et al. | 370/442 |
| 6,167,247 A | * | 12/2000 | Kannell et al. | 455/317 |
| 6,204,980 B1 | * | 3/2001 | Momtaz et al. | 360/29 |
| 6,711,396 B1 | * | 3/2004 | Bergsma et al. | 455/317 |
| 6,725,024 B1 | * | 4/2004 | Lindoff et al. | 455/255 |
| 6,756,924 B2 | * | 6/2004 | Lee et al. | 341/120 |
| 6,760,568 B2 | * | 7/2004 | Friedlander et al. | 455/78 |
| 6,766,157 B1 | * | 7/2004 | Hunzeker et al. | 455/317 |
| 2002/0094788 A1 | * | 7/2002 | Hayashi et al. | 455/73 |
| 2002/0094792 A1 | * | 7/2002 | Oono et al. | 455/118 |

OTHER PUBLICATIONS

Razavi, Behzad, "Design Considerations for Direct–Conversion Receivers," IEEE Transactions On Circuits and Systems—II: Analog and Digital Signal Processing, vol. 44, No. 6, Jun. 1997, pp. 428–435.

* cited by examiner

*Primary Examiner*—Sonny Trinh
(74) *Attorney, Agent, or Firm*—Withrow & Terranova, PLLC

(57) ABSTRACT

The present invention provides a dummy low noise amplifier (LNA) and an associated resistive network. Prior to DC offset correction, the primary LNAs are deactivated and the antenna is decoupled from the receive path leading to the inputs of the primary LNAs. A resistance is selected to provide a load at the input of the dummy LNA, wherein the load emulates the input load resistance seen by the primary LNA, which will be used to receive the incoming signal. Thus, the output of the dummy LNA emulates the performance of the primary LNA used to receive the incoming signal to allow accurate DC offset correction.

27 Claims, 2 Drawing Sheets

US 6,816,718 B2

DC OFFSET CORRECTION USING DUMMY AMPLIFIER

FIELD OF THE INVENTION

The present invention relates to DC offset correction, and in particular, to providing DC offset correction in multiple mode or multiple band mobile terminals and the like.

BACKGROUND OF THE INVENTION

Wireless communication systems support various access technologies, each of which can take numerous forms and be implemented in different frequency bands. For example, the standard analog access technology for U.S. cellular applications is advanced mobile phone system (AMPS), which uses a range of frequencies between 824 megahertz (MHz) and 894 MHz. Digital cellular applications typically use frequency division multiple access (FDMA), time division multiple access (TDMA), or code division multiple access (CDMA) access technologies. FDMA systems typically operate between 824 and 893 MHz. TDMA systems normally operate at either 800 MHz (interim standard (IS)-54) or 1900 MHz (IS-136) frequency bands. TDMA technology is implemented in the global system for mobile communications (GSM) standard in three different frequency bands, depending on geography. For example, GSM operates in the 900 MHz and 1800 MHz bands in Europe and Asia, and in the 1900 MHz band in the United States. In addition to GSM, TDMA is used in PCS (personal communication services)-based systems operating in the 1850 MHz to 1990 MHz bands. CDMA systems typically operate in either the 800 MHz or 1900 MHz frequency bands.

Given the lack of standardization and the varying infrastructure for the above systems, mobile terminals, such as mobile telephones, personal digital assistants, wireless modems, and the like, often need to communicate in different bands and operate in different modes, depending on the type of transmission technology used. In addition to providing analog capability, newer phones are supporting multiple modes and frequency bands.

To support such operation, mobile terminals typically incorporate dedicated low-noise amplifiers (LNAS) and associated filtering for each frequency band supported. Further, the down-conversion circuitry is configured to down-convert the received signals from various frequency bands and using various transmission technologies to an intermediate frequency (IF) or directly to a baseband level for baseband processing. The mixers used in the down-conversion circuitry are driven by local oscillators having varying frequencies depending on the mode of operation.

Unfortunately, the local oscillator energy can leak into the system and cause a DC offset in the down-converted signal. The local oscillator energy may leak into the antenna, which results in a signal that is amplified by the LNA and mixed into the down-converted signal, resulting in a DC offset. The local oscillator energy may also leak into the LNA inputs, causing the same result. Further, the local oscillator energy may leak into the input of the mixer, and ultimately be mixed with itself to create a DC offset. DC offsets may also be caused by mismatched devices that create an imbalance among the differential signals or out-of-band signals from other mobile terminals, base stations, and the like. The DC offset is particularly detrimental in systems wherein the down-converted signals are represented as baseband signals. Even in the absence of leakage signals, the differential signals provided by the down-conversion circuitry should have a common DC level. Typically, DC correction circuitry is used to sample the down-converted differential signals and adjust their DC levels to minimize the impact of any DC offset during baseband processing. For multiple band and multiple mode mobile terminals, switching from one mode or band to another typically affects the DC offsets associated with the differential signals, and requires a DC adjustment of these signals prior to receiving signals in each mode.

During DC offset correction, the antenna must be blocked so that the DC correction circuitry does not falsely lock onto an instantaneous signal level associated with a desired or interfering receive signal. Traditionally, there have been three methods to isolate the antenna from the rest of the system. The first method is to use a transmit/receive switch or duplexer to effectively open the path between the LNA and the antenna, and thus avoid any signals being presented to the LNA inputs. This method has proven unacceptable, in that the switch or the duplexer cannot provide complete isolation, and thus allows signals appearing at the antenna to reach the LNA, which results in an almost random DC level at the outputs of the LNAs. Another alternative is to selectively inject the RF path when more isolation is needed. This approach adds complexity and expense to the application. Yet another method is to turn off the LNA, and thus block signals from reaching the down-conversion circuitry. In this method, where the LNAs are deactivated, the DC offset correction takes place without compensating for LO leakage. Thus, when the LNA is reactivated, the DC offset caused by leakage signals is present. In essence, the latter method corrects for circuit imperfections, but does not address DC offsets induced by leakage signals. Accordingly, there is a need for an improved architecture and process for addressing and correcting DC offset injected into down-converted signals due to signal leakage and the like.

SUMMARY OF THE INVENTION

The present invention facilitates improved DC offset correction in a radio frequency receiver, which is capable of receiving signals using any number of communication technologies. In the receiver front end, multiple primary low noise amplifiers (LNAs) are provided and individually selected depending on a communication technology associated with a signal to be received. During reception, signals received at an antenna are coupled via a transmit-receive switch, duplexer, or like switching means, to a receive path leading to the inputs of the primary LNAs. The appropriate primary LNA is activated and the signal is amplified by the primary LNA, down-converted, and then processed at baseband. Prior to receiving the signal, the down-converted signals typically require DC offset correction. The present invention provides a dummy LNA and an associated resistive network. Prior to DC offset correction, the primary LNAs are deactivated and the antenna is decoupled from the receive path leading to the inputs of the primary LNAs. A resistance is selected to provide a load at the input of the dummy LNA, wherein the load emulates the input load resistance seen by the primary LNA, which will be used to receive the incoming signal. Thus, the output of the dummy LNA emulates the DC performance of the primary LNA used to receive the incoming signal to allow accurate DC offset correction.

In one embodiment, the dummy and primary LNAs have differential inputs and differential outputs. Further, a filter, preferably an acoustic wave filter, such as a surface acoustic wave filter, is placed between the switching means and the differential input of each primary LNA. Similarly, the dummy LNA has a differential input and output, and the resistive network provides selectable resistances across the differential input of the dummy LNA. The output of the dummy and primary LNAs may be coupled together and to differential inputs of down-conversion circuitry. In the preferred embodiment, the down-conversion circuitry provides quadrature-based down-conversion. Further, the outputs of the down-conversion circuitry are preferably differential in-phase and quadrature-phase intermediate frequency or very low intermediate frequency signals. DC offset correction circuitry is provided to monitor the respective DC levels of the differential in-phase and differential quadrature-phase signals to adjust the DC levels of the respective signals to a substantially common level prior to baseband processing. Although a differential embodiment is preferred, single ended LNA and filter embodiments also benefit from the present invention.

In operation, control logic, such as a central control system, a serial data interface, part of the baseband processing, or a combination thereof, may be used to control DC offset correction. The control logic functions to effect DC offset correction as follows. Upon determining the need to receive an incoming signal, the control logic will decouple the antenna from the receive path via the switching means, select an appropriate resistance of the resistive network for the input of the dummy LNA, and then activate the dummy LNA.

After allowing the system to settle, the control logic will instruct the DC offset correction circuitry to correct the DC levels of the respective differential in-phase and differential quadrature-phase signals provided by the down-conversion circuitry. Once DC offset correction is complete, the dummy LNA is deactivated and the appropriate primary LNA is activated. Finally, the switching means is instructed to couple the antenna to the receive path so that the incoming signal may be amplified by the appropriate primary LNA, down-converted, and processed at baseband in traditional fashion.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
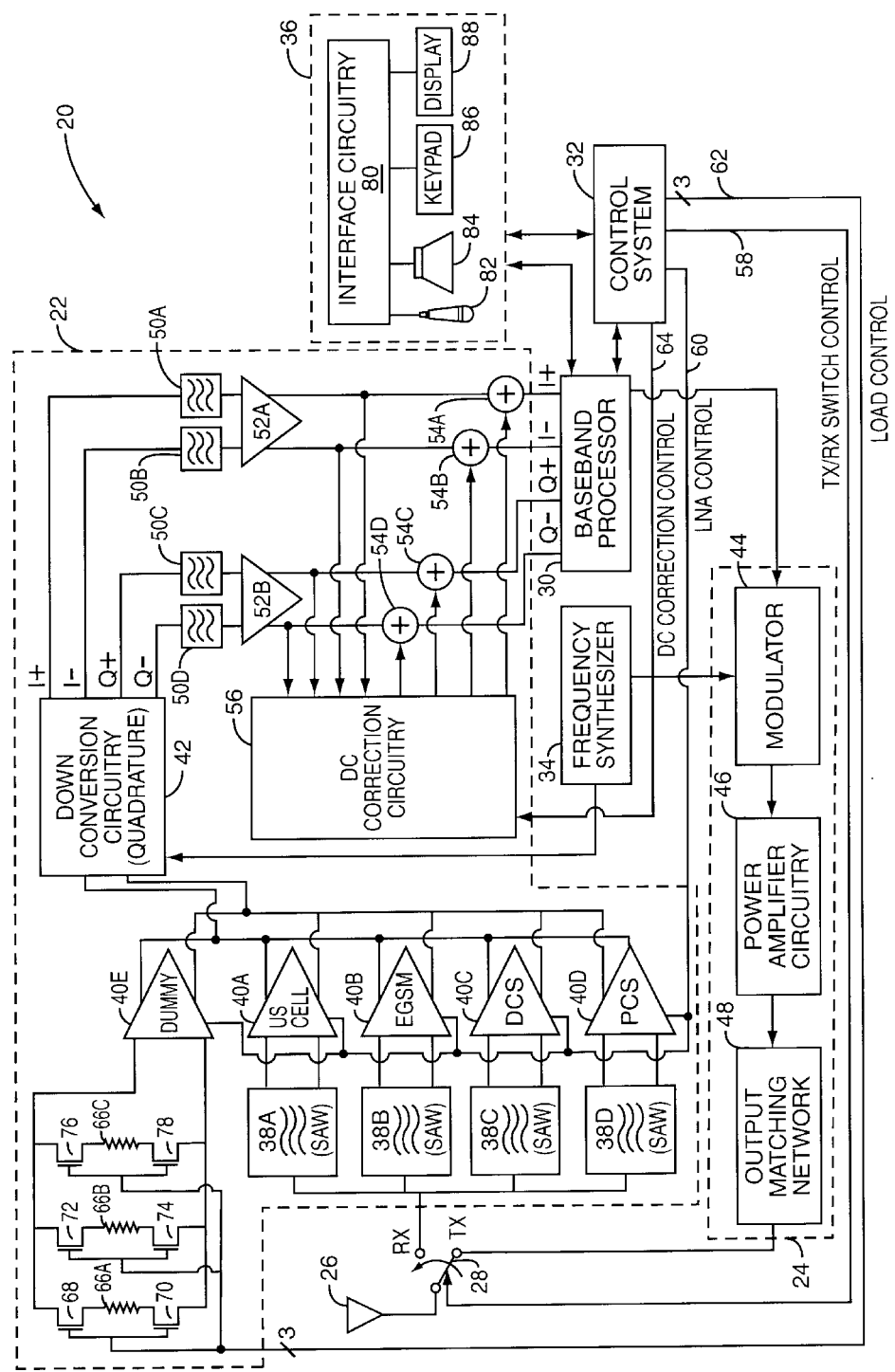
FIG. 1 is a block representation of a mobile terminal configured according to one embodiment of the present invention.

The present invention is preferably incorporated in a mobile terminal 20, such a mobile telephone, personal digital assistant, or the like. The basic architecture of a mobile terminal 20 is represented in FIG. 1 and may include a receiver front end 22, a radio frequency transmitter section 24, an antenna 26, a duplexer or transmit/receive (TX/RX) switch 28, a baseband processor 30, a control system 32, a frequency synthesizer 34, and interface circuitry 36. The receiver front end 22 receives information bearing radio frequency (RF) signals from one or more remote transmitters provided by an access point, such as a base station (not illustrated).

The illustrated receiver front end 22 is configured to receive signals from a number of communication bands facilitating a number of communication techniques. During reception of RF signals, the TX/RX switch 28 is positioned to connect the antenna 26 to a receive path containing a number of filters 38, which are individually connected to a primary low noise amplifier (LNA) 40A–40D. Each communication band is associated with one filter 38A–38D and one primary LNA 40A–40D. As illustrated in the disclosed example, there are four bands, corresponding to US Cellular, EGSM, DCS, and PCS. This exemplary configuration is only provided for the purposes of illustration and is not intended to limit the scope of the invention. Filter 38A and LNA 40A operate when receiving signals in the US Cellular band; filter 38B and LNA 40B operate when receiving signals in the EGSM band; filter 38C and LNA 40C operate when receiving signals in the DCS band; and filter 38D and LNA 40D operate when receiving signals in the PCS band. Preferably, the filters 38A–38D are surface acoustic wave (SAW) filters, or compatible filters, having a singled ended input and a differential output. The filters 38A–38D provide band-pass filtering about the corresponding communication band to minimize broadband interference and a differential output signal representative of the filtered RF signal.

The differential output signal for the given communication band is then sent to down-conversion circuitry 42, which provides differential quadrature down-conversion in traditional fashion. Accordingly, the differential output signal is down-converted to differential in-phase signals, I+ and I−, and differential quadrature signals, Q+ and Q−, representing the in-phase and quadrature components of the received signal. The in-phase and quadrature signals are down-converted to an intermediate frequency (IF), and preferably a very low IF (VLIF) or direct conversion (DCR), for baseband processing by the baseband processor 30 according to the communication band and technique used when generating the received signal. The baseband processor 30 processes the differential in-phase and quadrature signals, I+, I−, Q+, and Q− to extract the information or data conveyed in the received signal. The down-conversion circuitry 42 typically uses one or more mixing frequencies generated by the frequency synthesizer 34 to effect quadrature down-conversion. Since the baseband processing typically comprises demodulation, decoding, and error correction operations, the baseband processor 30 is generally implemented in one or more digital signal processors (DSPs).

On the transmit side, the baseband processor 30 receives digitized data, which may represent voice, data, or control information, from the control system 32, which it encodes for transmission. The encoded data is output to the transmitter 24, where it is used by a modulator 44 to modulate a carrier signal that is at a desired transmit frequency. The modulator 44 also uses one or more mixing frequencies generated by the frequency synthesizer 34 to effect modulation. Power amplifier circuitry 46 amplifies the modulated carrier signal to a level appropriate for transmission from the antenna 26. The amplified signal is coupled to the antenna 26 via the TX/RX switch 28 and an output matching network 48, which provides impedance matching between the power amplifier circuitry 46 and the antenna 26 and TX/RX switch 28.

The present invention is directed to an improved structure and technique for addressing DC offset within the differential in-phase signals I+ and I−, and the DC offset between the differential quadrature signals Q+ and Q− when transitioning to a receive state for any communication band. Accordingly, the following outlines the general techniques for compensating for such DC offsets and will be followed by a detailed discussion of how to use an additional, or dummy, LNA 40E to minimize DC offsets associated with leakage from the local oscillator in the frequency synthesizer 34.

Prior to baseband processing, the differential in-phase and quadrature signals, I+, I−, Q+ and Q− are preferably filtered with filters 50A–50D, respectively, and amplified with amplifiers 52A and 52B to a desired signal level. As illustrated, the relative DC levels of each of the differential in-phase and quadrature signals, I+, I−, Q+, and Q− are monitored by DC correction circuitry 56. The DC correction circuitry determines the relative DC levels for the differential in-phase and quadrature signals, I+, I−, Q+, and Q− and provides corresponding level adjustment outputs to adjust the DC levels of the individual differential in-phase and quadrature signals, I+, I−, Q+, and Q−. Each level adjustment output is summed with the corresponding one of the differential in-phase and quadrature signals, I+, I−, Q+, and Q− to effect DC offset correction using summing circuitry 54A–54D. The DC offset correction operates to force the DC levels of the differential in-phase signals I+ and I− to a common level, and the DC levels of the differential quadrature signals Q+ and Q− to a common level to reduce or eliminate distortion caused by having a DC offset between the respective differential signals.

As noted, the present invention incorporates a dummy LNA 40E in additional to the LNAs 40A–40D used to provide amplification for the various frequency bands. Preferably, all of the primary LNAs 40A–40D and the dummy LNA 40E are identically formed and configured on a common integrated circuit so as to provide uniform operation. The dummy LNA 40E has a differential input coupled to a resistive network, illustrated as comprising resistors 66A–66C. During DC offset correction, the resistive network provides a selectable resistance across the differential input of the dummy LNA 40E. The selected resistance is chosen to emulate the impedance that is normally presented to the differential input of one of the LNAs 40A–40D associated with the communication band that is going to be used for receiving the incoming signal. The selected resistance will correlate to the equivalent resistance at the output of the corresponding filter 38A–38D. Thus, the resistance reflects that provided by the corresponding one of the filters 38A–38D and any other residual resistance provided by elements between the input of the LNAs 40A–40D and the receive leg of the TX/RX switch 28. In one embodiment, the resistors 66A–66C are selectively coupled across the differential input of the dummy LNA 40E via switching transistor pairs, 68–70, 72–74, and 76–78, respectively. Those skilled in the art will recognize various types of selectable resistive networks capable of controlling the resistance provided across the differential input of the dummy LNA 40E.

For controlling DC offset correction according to the disclosed embodiment, control logic, represented by the control system 32, will control the TX/RX switch 28 using a TX/RX switch control signal 58, control the operational state of the LNAs 40A–40E using an LNA control signal 60, select the resistor(s) to place across the differential input of the dummy LNA 40E using a load control signal 62, and control the DC correction circuitry 56 using a DC correction control signal 64. The TX/RX switch control signal 58 controls the position of the switch 28. The LNA control signal 60 is used to selectively activate and deactivate any of the LNAs 40, including the dummy LNA 40E. The load control signal 62 may be used to selectively switch on the one or more transistor pairs 68–70, 72–74, and 76–78 to couple an appropriate resistance to the input of the dummy LNA 40E. The DC correction control signal 64 will preferably control when the DC correction circuitry 56 will operate to adjust the DC voltage levels of the differential in-phase and quadrature signals, I+, I−, Q+, and Q−.

Figure 2:
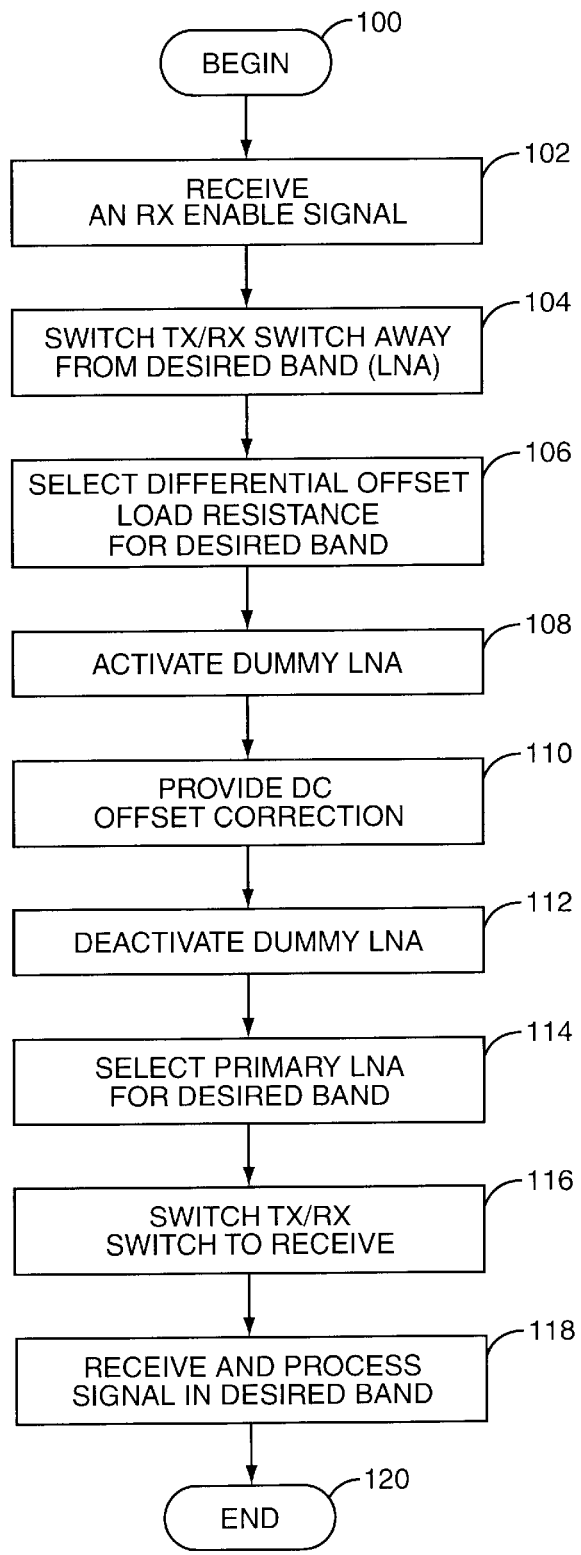
FIG. 2 is a flow diagram outlining a process for DC offset correction according to one embodiment of the present invention.

The DC offset correction process for the disclosed embodiment of the present invention is outlined in FIG. 2. Assume that each of the LNAs 40A–40E is initially deactivated. The process begins (step 100) when a receive enable signal, or like signal, is received by the control system 32 to indicate there is a need to receive an incoming signal (step 102). The control system 32 will next switch the TX/RX switch 28 away from the receive position or desired communication band (step 104). The resultant position of the switch 28 may be such that the antenna 26 is coupled to the transmit path or placed in an open position. If a duplexer or like switching means is used in place of the TX/RX switch 28, the device is configured to decouple the antenna 26 from the input of the filter 38 associated with the communication band for the incoming signal. Preferably, the antenna 26 is not coupled to any of the filters 38.

Next, the control system 32 places an appropriate resistance across the differential input of the dummy LNA 40E based on the communication band for the incoming signal (step 106) using the load control signal 62. As noted, the selected resistance corresponds to resistance normally seen at the input of the given LNA 40A–40D used during reception of the signal for the given communication band. The control system 32 will then activate the dummy LNA 40E (step 108) and allow the system to settle for a defined period of time (step 110). At this point, any differential output signals of the dummy LNA 40E are likely caused by local oscillator leakage or relatively continuous environmental conditions affecting the differential outputs of any of the LNAs 40A–40E. These differential output signals of the LNAs 40A–40E result in DC offsets in the differential in-phase and quadrature signals, I+, I−, Q+, and Q− due to the mixing action with the LO signal in the down-conversion circuitry 42.

Thus, the control system 32 activates the DC correction circuitry 56 to monitor the levels of the differential in-phase and quadrature signals, I+, I−, Q+, and Q− and provide any necessary DC offset correction (step 110). After DC offset correction, the control system 32 will deactivate the dummy LNA 40E (step 112) and select the appropriate LNA 40A–40D associated with the communication band for the incoming signal (step 114). Next, the control system 32 will switch the TX/RX switch 28 to the receive position, which will couple the antenna to the input of the appropriate filter 38A–38D associated with the communication band of the incoming signal (step 116) to initiate reception and processing of the received signal in the appropriate communication band (step 118), wherein the DC offset correction process of the present invention ends (step 120).

Those skilled in the art will recognize various ways to implement the concepts of the present invention. For example, the control system 32 may be or may incorporate a serial data interface, as is known in the art to provide the functionality and control described in association with the TX/RX switch control signal 58, the LNA control signal 60, the load control signal 62, and the DC correction control signal 64. Further, various aspects of the control system 32 and the baseband processor 30 may be integrated in various degrees. Additional information relating to receiver front ends, LNAs, and down-conversion technology may be found in *RF Microelectronics*, by Behzad Razavi, 1998, which is incorporated herein by reference in its entirety.

A user may interact with the mobile terminal 20 via the interface 36, which may include interface circuitry 80 associated with a microphone 82, a speaker 84, a keypad 86, and a display 88. The interface circuitry 80 typically includes analog-to-digital converters, digital-to-analog converters, amplifiers, and the like. Additionally, it may include a voice encoder/decoder, in which case it may communicate directly with the baseband processor 30.

The microphone 82 will typically convert audio input, such as the user's voice, into an electrical signal, which is then digitized and passed directly or indirectly to the baseband processor 30. Audio information encoded in the received signal is recovered by the baseband processor 30, and converted into an analog signal suitable for driving speaker 84 by the interface circuitry 80. The keypad 86 and display 88 enable the user to interact with the mobile terminal 20, input numbers to be dialed, address book information, or the like, as well as monitor call progress information.

Those skilled in the art will recognize improvements and modifications to the preferred embodiments of the present invention. For example, the communication bands represented in the above embodiment may vary in number and type. Further, the LNAs may have a singled ended input (non-differential), single ended output, or a combination thereof. All such improvements and modifications are considered within the scope of the concepts disclosed herein and the claims that follow.

What is claimed is:

1. Circuitry facilitating improved DC offset correction comprising:
    a) a plurality of primary low noise amplifiers, LNAs, each of which comprises an input adapted to receive filtered signals associated with a unique communication technology via an associated input filter and an output for operatively coupling to down-conversion circuitry;
    b) a dummy LNA comprising an input and an output operatively coupled to the outputs of the primary LNAs; and
    c) a resistive network operatively coupled to the input of the dummy LNA and adapted to selectively provide one of a plurality of resistances at the input of the dummy LNA, each of the plurality of resistances corresponding to a resistance load at the input of one of the plurality of the primary LNAs,
    wherein during DC offset correction, the one of the plurality of resistances associated with the one of the plurality of primary LNAs to use for receiving an incoming signal is selected, the plurality of primary LNAs are deactivated, and the dummy LNA is activated.

2. The circuitry of claim 1 wherein the output of the dummy LNA and the outputs of the plurality of primary LNAs are differential outputs.

3. The circuitry of claim 2 wherein the input of the dummy LNA and the inputs of the plurality of primary LNAs are differential inputs.

4. The circuitry of claim 3 further comprising a plurality of filters, each filter operatively and differentially coupled to the input of one of the plurality of primary LNAs and bearing on the value of a corresponding one of the plurality of resistances of the resistive network.

5. The circuitry of claim 4 wherein each of the plurality of filters is an acoustic wave filter.

6. The circuitry of claim 1 wherein each of the plurality of resistances is associated with at least one transistor operating in a switching mode and adapted to selectively couple the resistance to the input of the dummy LNA.

7. The circuitry of claim 1 further comprising down-conversion circuitry operatively coupled to the output of the dummy LNA and the outputs of the plurality of primary LNAs and adapted to facilitate a quadrature down-conversion of signals at the output of the dummy LNA and the outputs of the plurality of primary LNAs to provide differential in-phase signals and differential quadrature phase signals.

8. The circuitry of claim 7 further comprising DC offset correction circuitry adapted to monitor the DC levels of the differential in-phase signals and differential quadrature phase signals and provide an output to adjust the DC levels of the differential in-phase signals to a common level and to adjust the DC levels of the differential quadrature phase signals to a common level.

9. The circuitry of claim 8 further comprising control logic adapted to:
    a) select the one of the plurality of resistances that is associated with the one of the plurality of primary LNAs to use for receiving an incoming signal;
    b) deactivate any active ones of the plurality of primary LNAs;
    c) activate the dummy LNA; and
    d) trigger the DC offset correction circuitry to adjust the DC levels of the differential in-phase signals to a common level and to adjust the DC levels of the differential quadrature phase signals to a common level to effect the DC offset correction.

10. The circuitry of claim 9 wherein the control logic is further adapted to:
    a) deactivate the dummy LNA; and
    b) activate the one of the plurality of primary LNAs to use for receiving the incoming signal.

11. The circuitry of claim 10 wherein the control logic is further adapted to effect decoupling of an antenna from a receive path leading to the inputs of the plurality of primary LNAs prior to triggering the DC offset correction.

12. The circuitry of claim 11 wherein the control logic is further adapted to provide a delay after activating the dummy LNA to allow for component settling.

13. The circuitry of claim 11 wherein the control logic is further adapted to:
    a) couple the antenna to the receive path leading to the inputs of the plurality of primary LNAs; and
    b) receive the incoming signal via the one of the plurality of primary LNAs.

14. The circuitry of claim 9 wherein the control logic is further adapted to:
    a) trigger the DC offset correction circuitry to stop offset correction;

b) deactivate the dummy LNA; and c) activate the one of the plurality of primary LNAs to use for receiving the incoming signal.

15. The circuitry of claim 1 wherein the dummy LNA and the plurality of primary LNAs are fundamentally identical and formed on the same integrated circuit.

16. The circuitry of claim 1 wherein each of the primary LNAs is configured to operate only when receiving incoming signals for a corresponding one of a plurality of unique communication technologies.

17. A method comprising:

a) selecting one of a plurality of resistances to couple to an input of a dummy low noise amplifier (LNA), the one of the plurality of resistances selected emulating a resistance that is associated with an input load of one of a plurality of primary LNAs to use for receiving an incoming signal;

b) deactivating any active ones of the plurality of primary LNAs;

c) activating the dummy LNA; and d) triggering DC offset correction to adjust DC levels of differential in-phase signals to a common level and to adjust the DC levels of differential quadrature phase signals to a common level to effect DC offset correction, the differential in-phase signals and differential quadrature phase signals created by a quadrature down-conversion process of output signals from the dummy LNA.

18. The method of claim 17 further comprising:

a) deactivating the dummy LNA; and b) activating the one of the plurality of primary LNAs to use for receiving the incoming signal.

19. The method of claim 18 further comprising decoupling an antenna from a receive path leading to inputs of the plurality of primary LNAs prior to triggering the DC offset correction.

20. The method of claim 19 further comprising providing a delay after activating the dummy LNA to allow for component settling.

21. The method of claim 19 further comprising:

a) coupling the antenna to the receive path leading to the inputs of the plurality of primary LNAs; and b) receiving the incoming signal via the one of the plurality of primary LNAs.

22. The method of claim 17 further comprising:

a) decoupling an antenna from a receive path leading to inputs of the plurality of primary LNAs prior to triggering the DC offset correction;

b) triggering the DC offset circuitry to stop offset correction;

c) deactivating the dummy LNA; and d) activating the one of the plurality of primary LNAs to use for receiving the incoming signal.

23. The method of claim 17 wherein an output of the dummy LNA and outputs of the plurality of primary LNAs are differential outputs.

24. The method of claim 23 wherein an input of the dummy LNA and inputs of the plurality of primary LNAS are differential inputs.

25. The method of claim 24 wherein a receive path to each of the plurality of primary LNAs comprises a filter operatively and differentially coupled to the input of one of the plurality of primary LNAs and bearing on the value of a corresponding one of the plurality of resistances.

26. The method of claim 25 wherein each filter is an acoustic wave filter having a differential output.

27. Circuitry comprising:

a) means for selecting one of a plurality of resistances to couple to an input of a dummy low noise amplifier (LNA), the one of the plurality of resistances selected emulating a resistance that is associated with an input load of one of a plurality of primary LNAs to use for receiving an incoming signal;

b) means for deactivating any active ones of the plurality of primary LNAs;

c) means for activating the dummy LNA; and d) means for triggering DC offset correction to adjust DC levels of differential in-phase signals to a common level and to adjust the DC levels of differential quadrature phase signals to a common level to effect the DC offset correction, the differential in-phase signals and differential quadrature phase signals created by a quadrature down-conversion process of output signals from the dummy LNA.

* * * * *